United States Patent
Hueber et al.

(10) Patent No.: US 10,680,572 B2
(45) Date of Patent: Jun. 9, 2020

(54) METHODS AND APPARATUSES FOR TESTING INDUCTIVE COUPLING CIRCUITRY

(71) Applicant: NXP B.V., Eindhoven (NL)

(72) Inventors: Gernot Hueber, Linz (AT); Leonhard Kormann, Stallhofen (AT); Ian Thomas Macnamara, Graz (AT)

(73) Assignee: NXP B.V., Eindhoven (NL)

( * ) Notice: Subject to any disclaimer, the term of this patent is extended or adjusted under 35 U.S.C. 154(b) by 407 days.

(21) Appl. No.: 15/692,594

(22) Filed: Aug. 31, 2017

(65) Prior Publication Data
US 2019/0068156 A1 Feb. 28, 2019

(51) Int. Cl.
| | |
|---|---|
| H03H 7/38 | (2006.01) |
| H03H 7/01 | (2006.01) |
| H04L 25/49 | (2006.01) |
| G01R 27/02 | (2006.01) |
| H04L 25/02 | (2006.01) |

(Continued)

(52) U.S. Cl.
CPC ............. H03H 7/38 (2013.01); G01R 27/02 (2013.01); H03H 7/01 (2013.01); H03H 7/468 (2013.01); H03H 11/1278 (2013.01); H03H 11/1291 (2013.01); H04L 25/0278 (2013.01); H04L 25/49 (2013.01)

(58) Field of Classification Search
CPC ............ H03H 7/38; H03H 7/46; H03H 7/468; H03H 7/01; H03H 11/12; H03H 11/1278; H03H 11/1291; H04L 25/02; H04L 25/0278; H04L 25/49; G01R 27/02
See application file for complete search history.

(56) References Cited

U.S. PATENT DOCUMENTS

| | | | |
|---|---|---|---|
| 4,965,607 A | 10/1990 | Wilkins et al. | |
| 5,126,871 A * | 6/1992 | Jeffers | H04B 10/032 398/145 |

(Continued)

FOREIGN PATENT DOCUMENTS

EP 2722928 A1 4/2014

OTHER PUBLICATIONS

Extended European Search Report for Patent Appln. No. 18183207.2 (dated Jan. 4, 2019).

*Primary Examiner* — Gregory J Toatley, Jr.
*Assistant Examiner* — Lynda Dinh (57) ABSTRACT

Aspects of the disclosure are directed to auto-sweeping impedance-matching circuitry that matches an impedance of an RF antenna. As may be implemented in accordance with one or more embodiments, a transmitter that is configured and arranged to transmit signals to remote devices via the RF antenna, is used to communicate a plurality of test signals to the impedance-matching circuitry, with each test signal having a designated frequency and/or test signal pattern that is different than the designated frequency and/or test signal pattern of the other test signals. A characteristic of each of the test signals as passed through the impedance-matching circuitry is detected. For each of the test signals generated for the auto-sweep, the detected characteristic is compared to an expected characteristic for the test signal, and an output indicative of compliance of the impedance-matching circuitry with a design specification is generated and transmitted in response to the comparison.

20 Claims, 11 Drawing Sheets

(51) Int. Cl.
*H03H 11/12* (2006.01)
*H03H 7/46* (2006.01)

(56) References Cited

U.S. PATENT DOCUMENTS

| | | |
|---|---|---|
| 5,949,236 A | 9/1999 | Franchville |
| 6,952,565 B1 | 10/2005 | Takeda et al. |
| 9,584,175 B2 | 2/2017 | Waheed et al. |
| 2009/0046030 A1 | 2/2009 | Song et al. |
| 2012/0319697 A1* | 12/2012 | Gregg ................ G01R 31/2822 324/511 |
| 2014/0065982 A1 | 3/2014 | Suh et al. |
| 2015/0162909 A1* | 6/2015 | Bhuiyan ........ H03K 19/018557 326/30 |
| 2016/0134254 A1 | 5/2016 | Backes et al. |

* cited by examiner

METHODS AND APPARATUSES FOR TESTING INDUCTIVE COUPLING CIRCUITRY

BACKGROUND

Impedance matching is important for a multitude of disparate types of circuitry, and ensuring proper operation of impedance-matching circuitry can be important to ensure quality and long-term performance. For instance, NFC (near field communication) controller integrated circuits (ICs) often provide a mechanism to check that discrete components are operating properly. Such components may, for example, include impedance matching circuitry connected between a chip and a contactless antenna. It can be important to ensure that these components are properly soldered on a PCB (printed circuit board) or otherwise connected. Such approaches may be referred to as an antenna self-test, and can facilitate the production test of a device that embeds an NFC solution.

While such testing approaches are valuable, they can be challenging to implement. For instance, it can be useful to ensure that RF (radio frequency) front-end components such as a matching network and antenna, meet design specifications. Variations in circuit operation may cause a shift in signal communications (transmission and/or receiving) gain and resonant frequency in an antenna and matching network, which may in turn have a significant impact to signal communications performance. For example, degradation in receiver circuitry gain can degrade receiver sensitivity. In addition, issues with transmission gain can reduce output power from an NFC driver into a matching network and antenna system, which may in essence lower power radiated from the antenna. Probing circuitry in order to test for such aspects can be difficult to do with accuracy, and may require circuit design modifications and space for utilizing a probe.

These and other matters have presented challenges to impedance matching circuitry and its implementation, for a variety of applications.

SUMMARY

Various example embodiments are directed to methods and/or apparatuses that involve auto-sweeping impedance-matching circuitry that matches an impedance of an RF antenna and that communicates signals between the RF antenna and receiver circuitry that processes RF signals received via the RF antenna. Such approaches may be implemented to address challenges, including those noted above.

As may be implemented in accordance with one or more embodiments, a transmitter that is configured to transmit signals to remote devices via the RF antenna, is used to communicate a plurality of test signals to the impedance-matching circuitry as noted above. Each test signal has a designated frequency or test signal pattern that is different than a designated frequency or test signal pattern of the other test signals. A characteristic of each of the test signals as passed through the impedance-matching circuitry is detected. For each of the test signals generated for the auto-sweep, the detected characteristic is compared to an expected characteristic (e.g., for the designated frequency or test signal pattern with which the test signal is communicated), and an output indicative of compliance of the impedance-matching circuitry with a design specification is generated in response to the comparison.

In accordance with one or more embodiments, an apparatus includes impedance-matching circuitry configured and arranged to match an impedance of a radio frequency (RF) antenna, and to communicate signals between the RF antenna and receiver circuitry that processes RF signals received via the RF antenna. The apparatus further includes a transmitter including a combinatorial test controller, sensor circuitry and testing circuitry. The transmitter is configured and arranged to transmit signals to remote devices via the RF antenna, and to auto-sweep the impedance-matching circuitry by communicating a plurality of test signals to the impedance-matching circuitry, with each test signal having a designated frequency and/or test signal pattern that is different than the designated frequency and/or test signal pattern of the other test signals. Accordingly, the combinatorial test controller may combine multiple different sensor patterns (e.g. voltages, currents, and other characteristics), which may be based at the same or different frequencies. The sensor circuitry is configured and arranged to detect a characteristic of each of the test signals as passed through the impedance-matching circuitry. The testing circuitry is configured and arranged with the sensor circuitry to, for each of the test signals generated for the auto-sweep, compare the detected characteristic of the test signal to an expected characteristic for the designated frequency or test signal pattern with which the test signal is communicated, and in response to the comparisons, generate an output indicative of compliance of the impedance-matching circuitry with a design specification.

In accordance with one or more particular embodiments, an apparatus includes an RF antenna, a transmitter, a receiver, and impedance-matching circuitry that matches an impedance of the RF antenna. The impedance-matching circuitry is further operable to communicate signals from the transmitter to the RF antenna, and to communicate RF signals received on the RF antenna to the receiver. The testing circuitry operates the transmitter to transmit continuous wave test signals to the impedance-matching circuitry, and detects the amplitude and phase of each continuous wave test signal as having passed through the impedance-matching circuitry and as received at the receiver. The detected amplitude and phase of each of the continuous wave test signals is compared to expected amplitude and phase for the particular frequency at which the continuous wave test signals are transmitted. An output indicative of compliance of the impedance-matching circuitry with a design specification is provided, based on the comparison.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description and in connection with the accompanying drawings, in which.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as may be used throughout this application is by way of illustration, and not limitation.

DETAILED DESCRIPTION

Aspects of the present disclosure are believed to be applicable to a variety of different types of apparatuses, systems and methods involving testing of circuitry using a frequency sweep at designated frequencies (e.g., in a range around a carrier frequency). In certain implementations, aspects of the present disclosure have been shown to be beneficial when used in the context of impedance-matching circuitry in an environment involving a transmitter and receiver, with the transmitter being utilized to carry out a frequency sweep and/or test signal pattern sweep of the impedance-matching circuitry. Such approaches may facilitate the testing and/or calibration of circuitry that may otherwise be difficult or impossible, and may address various challenges including those noted above. While not necessarily so limited, various aspects may be appreciated through a discussion of examples using such exemplary contexts.

According to various example embodiments, aspects of the present disclosure are directed to methods, apparatuses and/or systems for testing RF behavior, as may be applicable to matching networks utilized for communicating signals. Such testing may, for example, be useful for implementation as a production test. A transmitter that is configured/utilized for communicating with remote devices via an antenna when in use, is also used in a test scenario (e.g., at the factory, prior to customer use), to generate a test signal for testing impedance-matching circuitry that connects the transmitter to the antenna. One or more sensors are configured/utilized to sense one or more characteristics of the impedance-matching circuitry that are responsive to the test signal. The sensed characteristics can be used to evaluate the impedance-matching circuitry, such as to determine whether operation thereof falls within an acceptable range of one or more characteristics, such as amplitude/magnitude, reflection and phase. For instance, magnitude can be evaluated via RSSI (received signal strength indicator) or CORDIC (coordinate rotation by digital computer), phase can be evaluated using a CORDIC block, and position of the notch of a transmission reflection coefficient can be assessed.

Accordingly, such self-testing capability using componentry such as actuators and sensors that are integrated into the device, can provide desired testing and, where appropriate, alleviate the need to utilize external measurement equipment. Further, achievable accuracy levels can provide screening for small component variations, which can provide information that is more useful than a functional test that may only indicate whether circuitry being tested is present or shorted. This screening can also be carried out in a rapid manner, which can save time during production tests.

One or more embodiments use a transmitter current detector as a sensor to estimate the transmission reflection coefficient (=S(1,1) at the transmitter port). This data may be verified for a nominal carrier frequency, and used to check the magnitude of the current against an upper and lower limit that has been defined for a specific platform (and thus matching network). Such measurements can be carried out at multiple different frequencies, and used to estimate the shape of the reflection coefficient of the transmitter (=S(1, 1)).

In certain embodiments, a binary search is used for sweeping the frequency, to search for the position of the resonant frequency. The resonant frequency (e.g., represented as reflection or as direct metric) may be represented as a single peak (for the amplitude) or single notch (for the reflection coefficient). The resonant frequency (represented as reflection or as direct metric) may be represented as two or more peaks (for the amplitude) (as a main, secondary . . . peak) or two or more notches (for the reflection coefficient) (as a main, secondary . . . notch). Using a proper frequency sweep, the shape of the frequency response (by means of the reflection coefficient) can be captured.

Various calibration approaches may be carried out using one or more of the circuits and approaches characterized herein. For instance, transmitter tuning, transmitter voltage trimming, AGC (automatic gain control) resistor offset, and phase offsets can be used in calibration.

Various example embodiments are directed to methods and/or apparatuses that involve auto-sweeping impedance-matching circuitry that matches an impedance of an RF antenna and that communicates signals between the RF antenna and receiver circuitry that processes RF signals received via the RF antenna. As may be implemented in accordance with one or more embodiments, an apparatus includes impedance-matching circuitry configured and arranged to match an impedance of a radio frequency (RF) antenna, and to communicate signals between the RF antenna and receiver circuitry that processes RF signals received via the RF antenna. The apparatus further includes a transmitter having a combinatorial test controller, sensor circuitry and testing circuitry. The transmitter is configured and arranged to transmit signals to remote devices via the RF antenna, and to auto-sweep the impedance-matching circuitry by communicating a plurality of test signals (e.g., continuous-wave signals) to the impedance-matching circuitry, with each test signal having a designated frequency and/or test signal pattern that is different than the designated frequency and/or test signal pattern of the other test signals. For instance, a frequency sweep can be performed by communicating different test signals, each having a common test signal pattern and being communicated at different frequencies. A test signal pattern sweep can be performed by communicating different test signals at a common frequency, with each test signal having a different test signal pattern. Further, but frequency and test signal pattern can be modified for respective signals in the sweep.

The sensor circuitry is configured and arranged to detect a characteristic of each of the test signals (e.g., voltage amplitude, phase, and/or current characteristics) as passed through the impedance-matching circuitry. The testing circuitry is configured and arranged with the sensor circuitry to, for each of the test signals generated for the auto-sweep, compare the detected characteristic of the test signal to an expected characteristic for the designated frequency or test signal patter with which the test signal is communicated, and in response to the comparisons, generate an output indicative of compliance of the impedance-matching circuitry with a design specification.

Unless otherwise specified, "combinatorial test controller" refers to or includes a test circuit configured generate a set of test signals, in which the set includes signals which are different in terms of frequency, test signal pattern, and/or a combination of having different designated frequency and test signal pattern.

In some implementations, the transmitter includes two different transmitters respectively configured and arranged to transmit respective ones of the test signals. The sensor circuitry and testing circuitry operate to assess test signals communicated by one or both transmitters.

A variety of characteristics of the test signals can be assessed, using a variety of approaches. In some embodiments, the sensor circuitry detects multiple characteristics for each of the test signals. The testing circuitry operates with the sensor circuitry to, for each of the test-signals generated for the auto-sweep, compare each of the detected characteristics to respective expected characteristics for a designated frequency at which the test signal is communicated.

The transmitter and receiver are operated to facilitate testing in a variety of manners. In some embodiments, the transmitter communicates respective ones of the test signals under different driver output impedance configurations. The testing circuitry compares the detected characteristics at each of the different driver output impedances to expected characteristics for each driver output impedance. In other embodiments, the receiver provides different input resistances for receiving respective ones of the test signals, and the testing circuitry compares the detected characteristics at each of the different input resistances to expected characteristics for each input resistance. In certain embodiments, the transmitter communicates the signals under the different driver output impedance configurations, and the receiver provides different input resistances, to provide respective combinations of output impedance and input resistance.

In some embodiments, switching circuitry operates to couple test signals generated by the transmitter to the sensor circuitry in a testing mode. In an operational mode, the switching circuitry couples RF communication signals generated by the transmitter to the antenna via the impedance-matching circuitry. As such, the same transmitter used for transmitting RF communication signals to a remote receiver via an RF antenna can be used to generate test signals routed internally to a receiver. Further, the transmitter may utilizing the detected characteristics in transmitting RF signals in the operational mode.

The impedance-matching circuitry can be tested with an auto-sweep as follows. The transmitter is set to one of the designated sweep frequencies, and a test signal is communicated at the one of the designated sweep frequencies. A characteristic of the test signal is detected at the one of the designated sweep frequencies. The steps of setting, communicating and detecting are repeated for each of a plurality of designated sweep frequencies.

In some embodiments, the testing circuitry is configured and arranged with the sensor circuitry to calibrate the transmitter in response to the comparisons, such as by setting an operational parameter of the transmitter based on the comparisons. For instance, if the comparisons indicate that a particular characteristic is out of specification, the transmitter operating parameters can be adjusted to bring the particular characteristic within specification.

Various methods may be implemented in accordance with embodiments herein, such as utilizing circuitry and testing impedance-matching circuitry as noted above. In accordance with one or more embodiments, a transmitter (as may include a combinatorial test controller as noted herein) communicates a plurality of test signals (e.g., continuous-wave signals) to auto-sweep the impedance-matching circuitry, with each test signal having a designated frequency and/or test signal pattern that is different than the designated frequency and/or test signal pattern of the other test signals. A characteristic of each of the test signals (e.g., voltage amplitude, phase, and/or current characteristics), as passed through the impedance-matching circuitry, is detected. For each of the test signals generated for the auto-sweep, the detected characteristic is compared to an expected characteristic for the designated frequency or test signal pattern with which the test signal is communicated. In some implementations, multiple characteristics of each of the test signals are detected and compared to respective expected characteristics for the designated frequency or test signal pattern at which the test signal is communicated. An output indicative of compliance of the impedance-matching circuitry with a design specification is generated in response to the comparison(s).

In some implementations, each auto-sweep of the impedance-matching circuitry is carried out by setting the transmitter to one of a plurality of designated sweep frequencies, communicating a test signal at the one of the designated sweep frequencies, and detecting a characteristic of the test signal at the one of the designated sweep frequencies. The steps of setting, communicating and detecting are then repeated for each of a plurality of designated sweep frequencies, for each auto-sweep.

In some embodiments, an auto-sweep as above is used for calibrating the transmitter. An operational parameter of the transmitter can be set based on the comparisons. For instance, if the comparisons indicate that a particular characteristic is out of specification, the transmitter operating parameters can be adjusted to bring the particular characteristic within specification.

Figure 1:
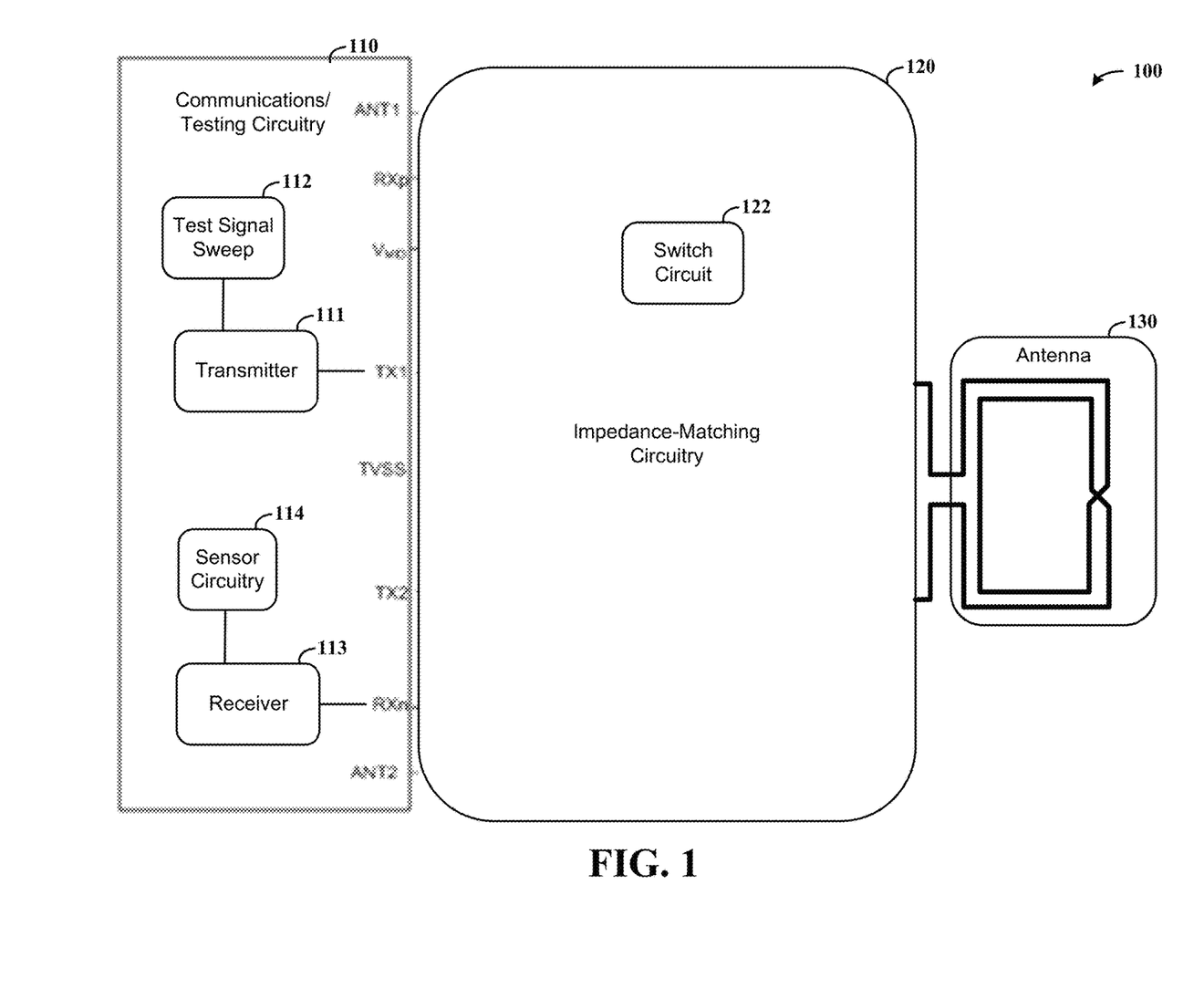
FIG. 1 shows an apparatus for testing of impedance-matching circuitry, in accordance with various aspects of the disclosure.

Turning now to the figures, FIG. 1 shows an apparatus 100 for testing of impedance-matching circuitry, in accordance with various aspects of the disclosure. The apparatus 100 includes communications/testing circuitry 110, impedance-matching circuitry 120, and antenna 130. The communications/testing circuitry 110 includes a transmitter 111 that operates to transmit signals to remote receivers via the impedance-matching circuitry 120 and antenna 130, and that further operates to carry out a test-signal sweep by generating test signals for testing the impedance-matching circuitry 120. The test-signal sweep may involve a frequency sweep with test signals communicated at different frequencies, a test pattern sweep with test signals communicated with different test patterns, or a combination thereof. A test signal sweep control circuit 112, as may include a combinatorial test controller, may be implemented to control the test-signal sweep operation of the transmitter 111, as a separate component or integrated within the transmitter.

A receiver 113 operates to receive signals transmitted to the apparatus 100, collected at the antenna 130 and passed to the receiver via the impedance-matching circuitry 120. The receiver also receives test signals passed on the impedance-matching circuitry by the transmitter via the test-signal sweep, and provides the test signals for sensing at sensor circuitry 114, which may be integrated with the receiver 113.

The test-signal sweep can be carried out in a variety of manners. In some embodiments, the impedance-matching circuitry 120 includes one or more switches or other components, with switch 122 shown by way of example, that direct the test signals to appropriate circuitry and back to the receiver 113. For instance, one or more switching circuits may route the test signals back to the receiver 113, rather than to the antenna 130. Such switching circuits may also be implemented for routing the test signals through particular circuits in the impedance-matching circuitry, for explicitly testing those particular circuits.

The various embodiments described herein may be combined in certain embodiments, and various aspects of individual embodiments may be implemented as separate embodiments. For instance, aspects of FIG. 1 may be implemented separately, such as to provide the transmitter 111 with test-signal sweeping control, or to provide a combination of the frequency sweep with one or both of switching in the impedance-matching circuitry and sensor circuitry 114 for characterizing results of the test-signal sweep.

Figure 2:
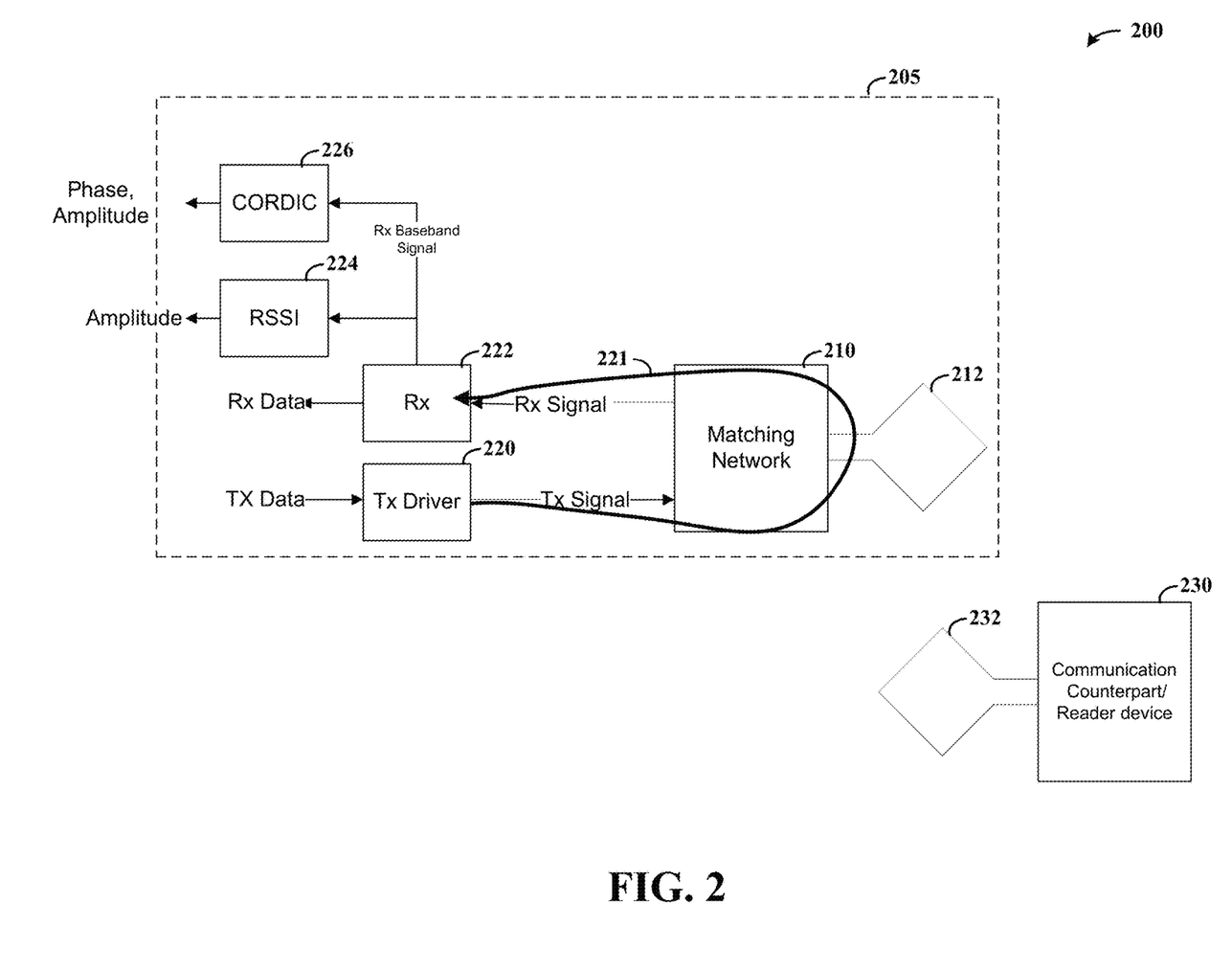
FIG. 2 shows an apparatus for testing of impedance-matching circuitry, in accordance with one or more aspects of the disclosure.

FIG. 2 shows an apparatus 200 for testing of impedance-matching circuitry, in accordance with one or more aspects of the disclosure. An impedance-matching network 210 provides communications between an antenna 212 and both a transmitter 220 and receive 222, for communicating signals with a remote device, such as with a reader device 230 and its antenna 232, which are shown by way of example. The transmitter 220 is configured to generate test signals that are passed on the impedance-matching network 210 and back to the receiver 222, as represented generally by circuit path 221. The test signals may be presented over respective frequencies to provide a frequency sweep of the impedance-matching network 210. Further, the test signals may be passed via antenna 212 as well.

One or more sensor circuits may be used, to suit particular test applications. In some implementations, RSSI circuitry 224 and CORDIC circuitry 226 are provided for respectively sensing/detecting amplitude and phase/amplitude of signals received at the receiver 222. Further, the impedance-matching network 210 may include internal switching circuitry that facilitates routing of the signals transmitted by the transmitter 220 back to the receiver 222, after passing through one or more circuits to be tested within the impedance-matching network. Further, the circuitry may be provided on a card 205.

Figure 3A:
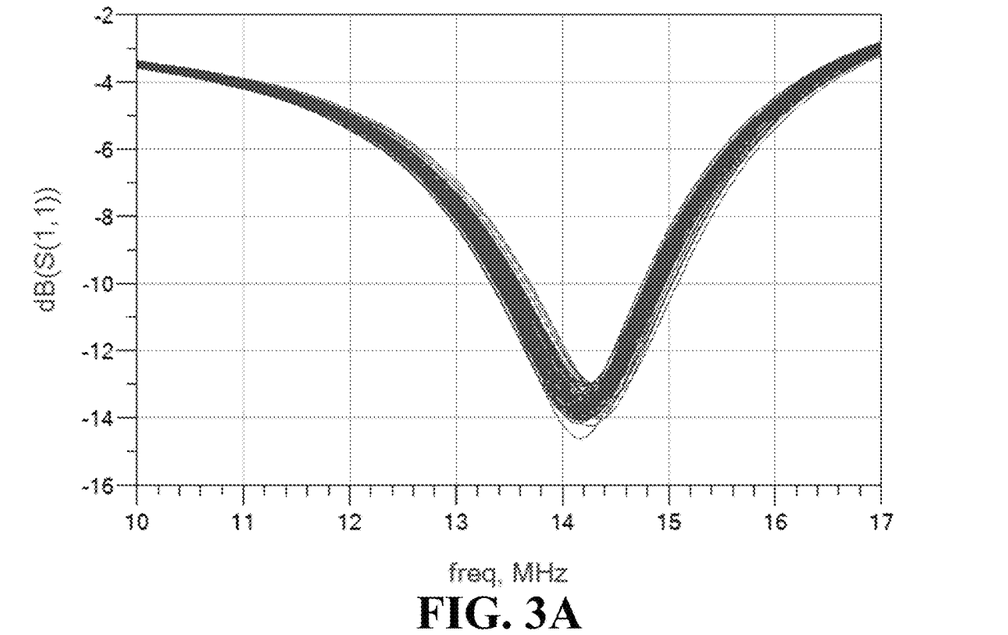
FIGS. 3A-3B show plots for signal evaluation based on magnitude, in accordance with one or more aspects of the disclosure.
Figure 3B:
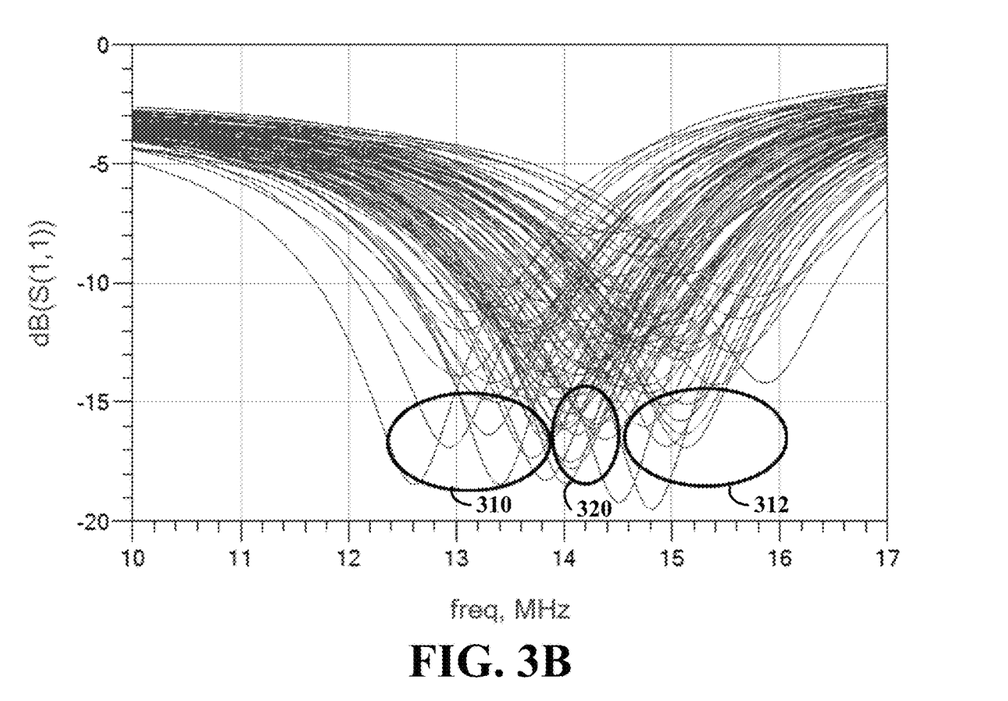

A variety of test signals can be generated and used to provide a variety of responses for analyzing circuitry characteristics. Test signals returned to a receiver can be evaluated for compliance with an expected signal, along with a range of tolerated variance from the expected signal, for assessing circuitry. FIGS. 3A-3B show plots for signal evaluation based on magnitude, in accordance with one or more aspects of the disclosure. FIGS. 3A and 3B show a simulated magnitude of reflection for a transmitter port (S(1,1)), respectively with nominal component value variation (FIG. 3A) and a component value variation in the matching network that is about 10-times above an expected nominal component value variation (FIG. 3B). These plots can be used for comparing actual magnitude sensed during testing, and the comparison can be used to evaluate the circuitry from which the magnitude is sensed. In FIG. 3A, the resonance frequency shifts from the nominal expected part are low, whereas in FIG. 3B, the resonance frequency shifts significantly from the nominal expected part (and beyond 1 MHz from that frequency). For instance, signals falling within the range shown at 310 and 312 may be deemed to represent a failed component, whereas signals falling within the range shown at 320 may be deemed to represent an acceptable component.

Figure 4A:
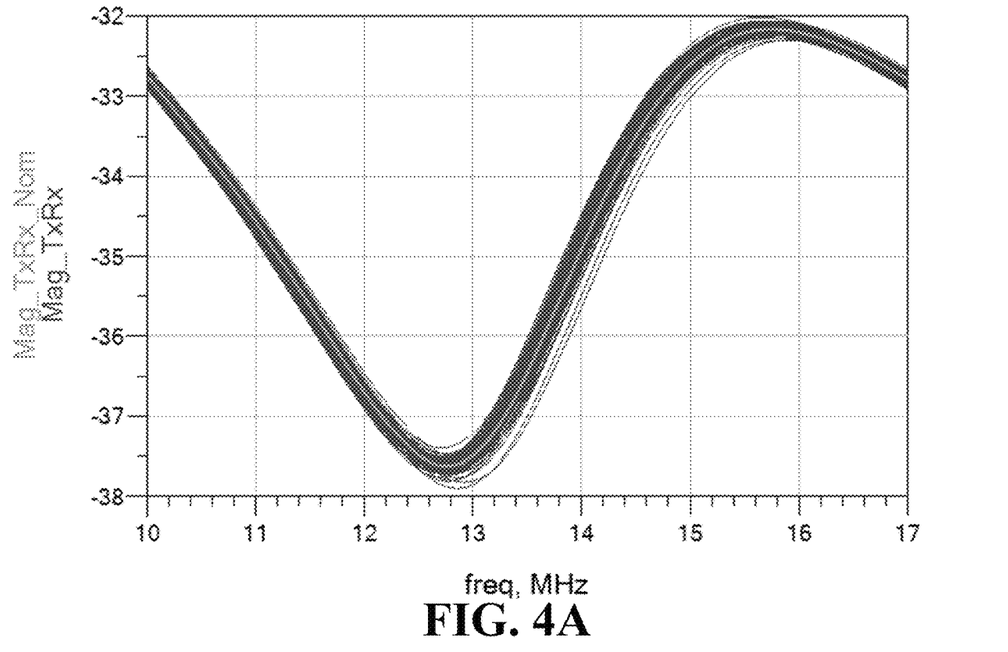
FIGS. 4A-4B show plots for signal evaluation based on frequency, in accordance with one or more aspects of the disclosure.
Figure 4B:
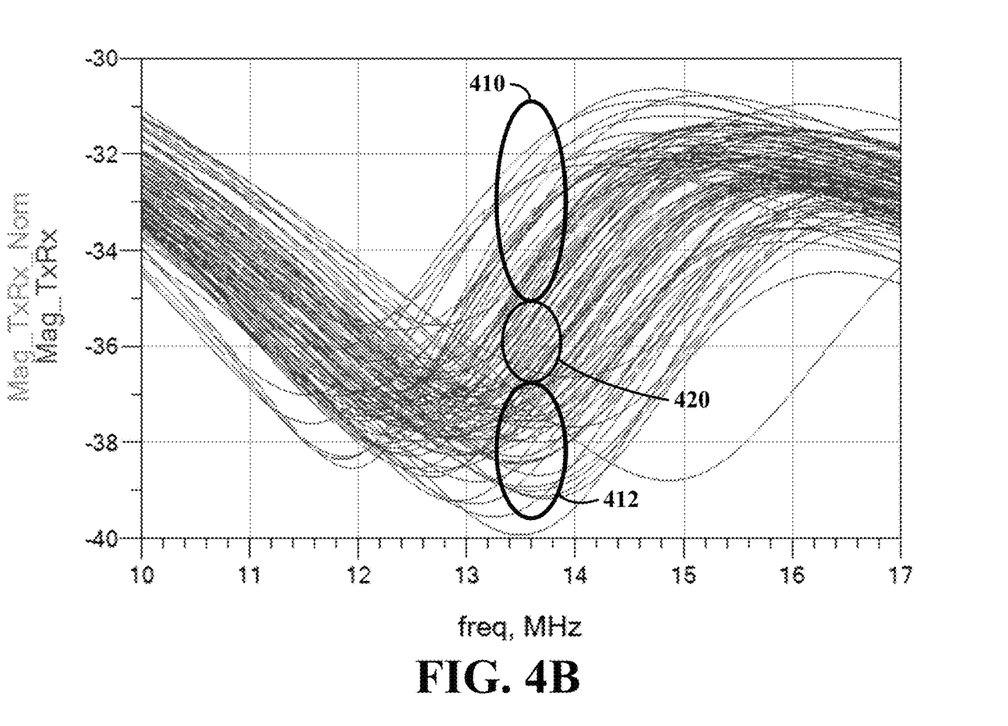

FIGS. 4A and 4B show plots for signal evaluation based on frequency, in accordance with one or more aspects of the disclosure. FIGS. 4A and 4B show magnitude from the transmitter to the receiver, respectively representing an expected component variation in the matching network (FIG. 4A), and component variation that is 10-times the expected component variation (FIG. 4B). Using these plots, signals falling within the range shown at 410 and 412 may be deemed to represent a failed component, whereas signals falling within the range shown at 420 may be deemed to represent an acceptable component.

Figure 5A:
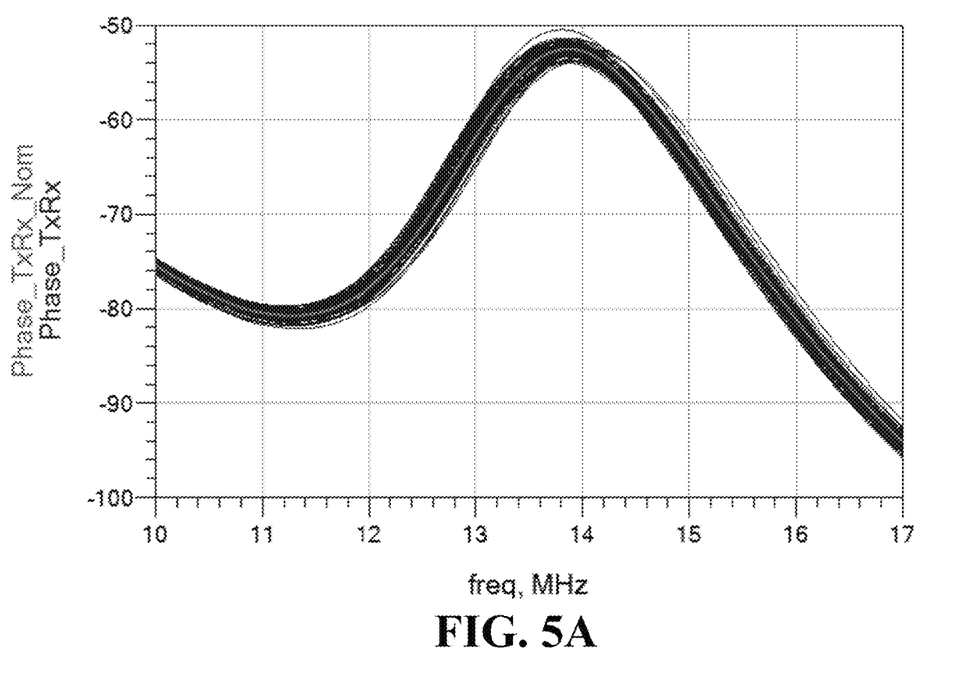
FIGS. 5A-5B show plots for signal evaluation based on phase, in accordance with one or more aspects of the disclosure.
Figure 5B:
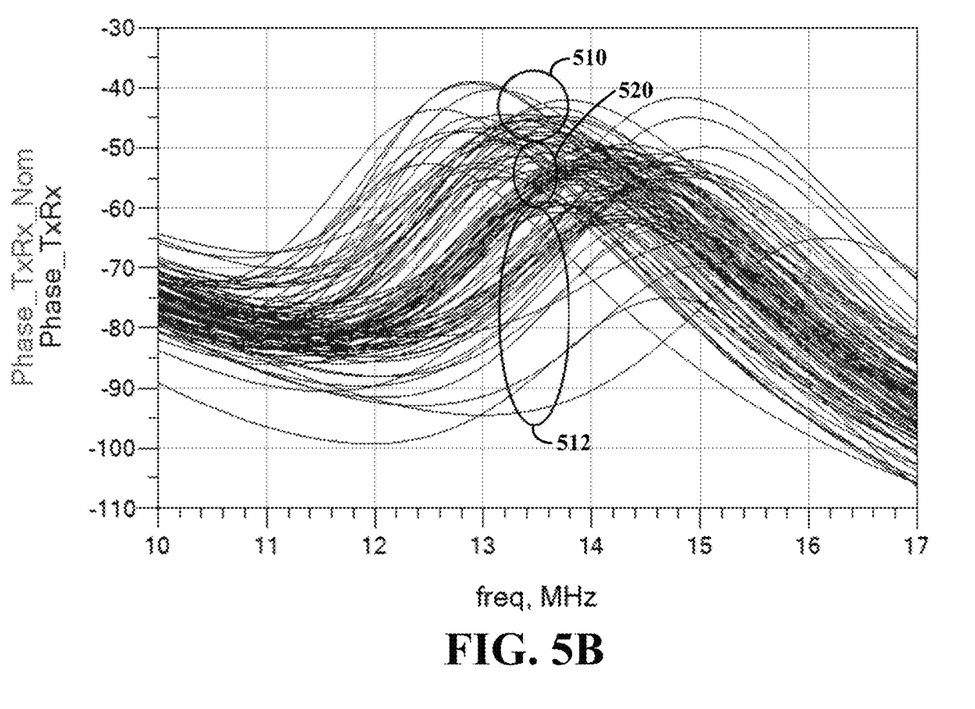

FIGS. 5A and 5B show plots for signal evaluation based on phase, in accordance with one or more aspects of the disclosure. FIGS. 5A and 5B show simulated phase from transmitter to receiver, respectively for an expected component variation in the matching network (FIG. 5A) and for component variation that is 10-times the expected component variation (FIG. 5B).

A frequency sweep can be used to avoid false positives, such as where signal characteristics are within tolerance (e.g., magnitude and phase) at a particular frequency, yet may be out of tolerance at other frequencies. It has been recognized/discovered that this frequency sweep approach can not only be provided with on-board transmitters and receivers that are used for communicating with remote devices, it can provide an accurate indication of component variations over a range of frequencies. For instance, as shown in FIG. 4B, a pass-limit of +/−1 dB around a nominal magnitude of −36 dB as noted at 420 can be used as a pass/fail limit. Any samples with a measured magnitude above or below will be rejected. Different frequencies, such as +/−1 MHz and/or +/−2 MHz around a nominal frequency (e.g., 13.56 MHz), can be utilized. A part may be deemed to have passed the test if individual tests with the respective frequencies are within defined limits for one or both of magnitude and phase, or other characteristics being analyzed. Certain approaches involve assessing local minimums or maximums of magnitude and/or phase, and check the measured local extrema position against a limit.

Figure 6:
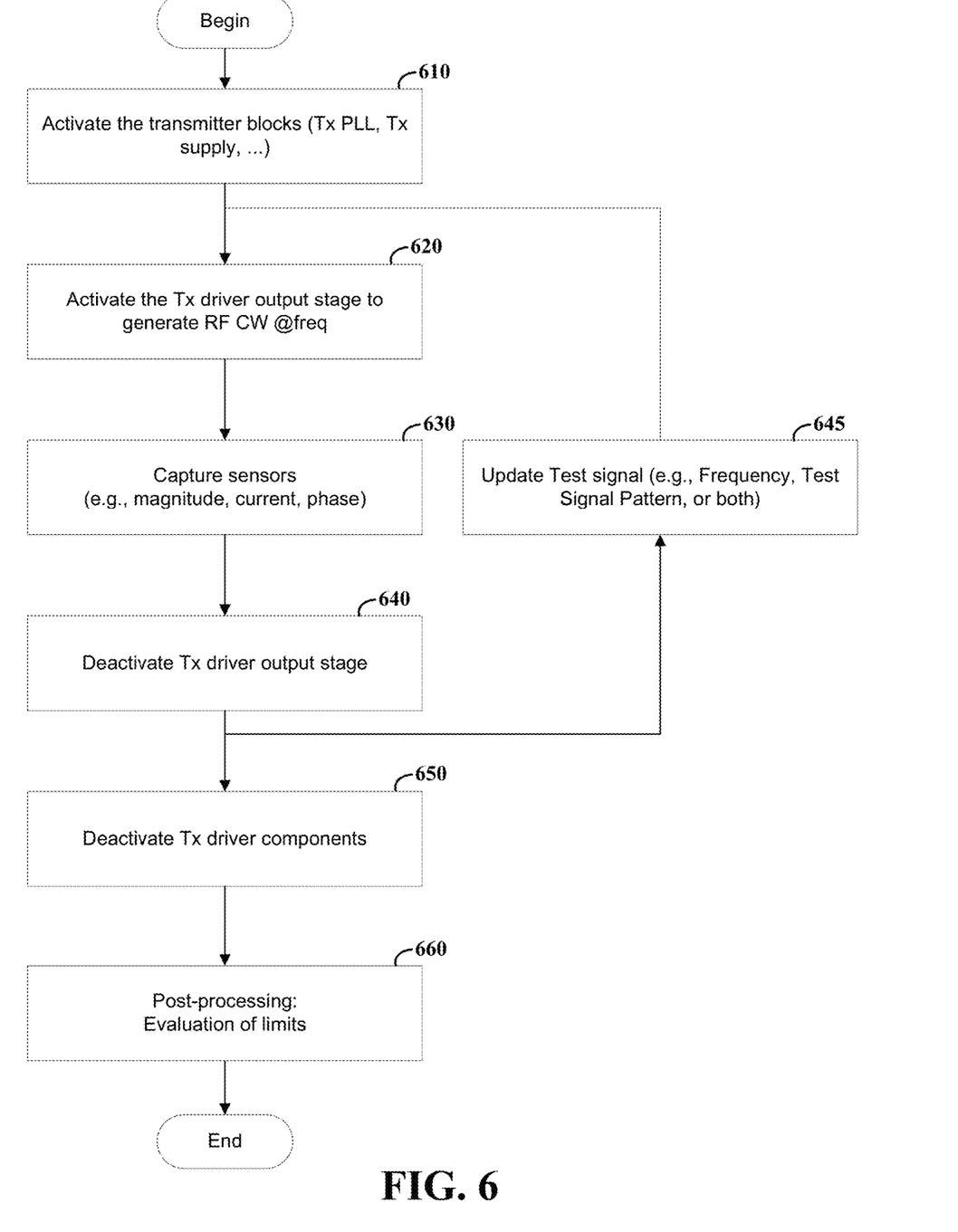
FIG. 6 shows a flow diagram for testing of impedance-matching circuitry, in accordance with various aspects of the disclosure.

FIG. 6 shows a flow diagram for testing of impedance-matching circuitry, in accordance with various aspects of the disclosure. This algorithm/sequence can be implemented, for example, within circuitry such as that shown in FIGS. 1 and 2, for test-signal sweeping and analyzing test signals passed via circuitry being analyzed. At block 610, transmitter blocks are activated, and a transmitter driver output stage is activated at block 620 to generate a radio frequency signal at a designated frequency. At block 630, sensors are implemented to capture/detect signal characteristics, such as magnitude, current and phase. At block 640, the transmitter driver output stage is deactivated. Where a frequency sweep is to be performed, the frequency is updated at block 645 to a new/different frequency, and the sequence noted above through blocks 620, 630 and 640 is carried out for the new/different frequency. Where a test signal pattern sweep is to be performed, the test signal pattern is updated at block 645 to a new/different test signal pattern, and the sequence noted above through blocks 620, 630 and 640 is carried out for the new/different test signal patter. Both frequency and test signal pattern may also be updated at block 645.

Once a desired/set number (one or more) of characteristics have been sensed, the transmitter driver components are deactivated at block 650, and limits/characteristics are evaluated during post-processing at block 660. The evaluation at block 660 may also be carried out with the capture or after the capture at block 630, for each frequency.

Figure 7:
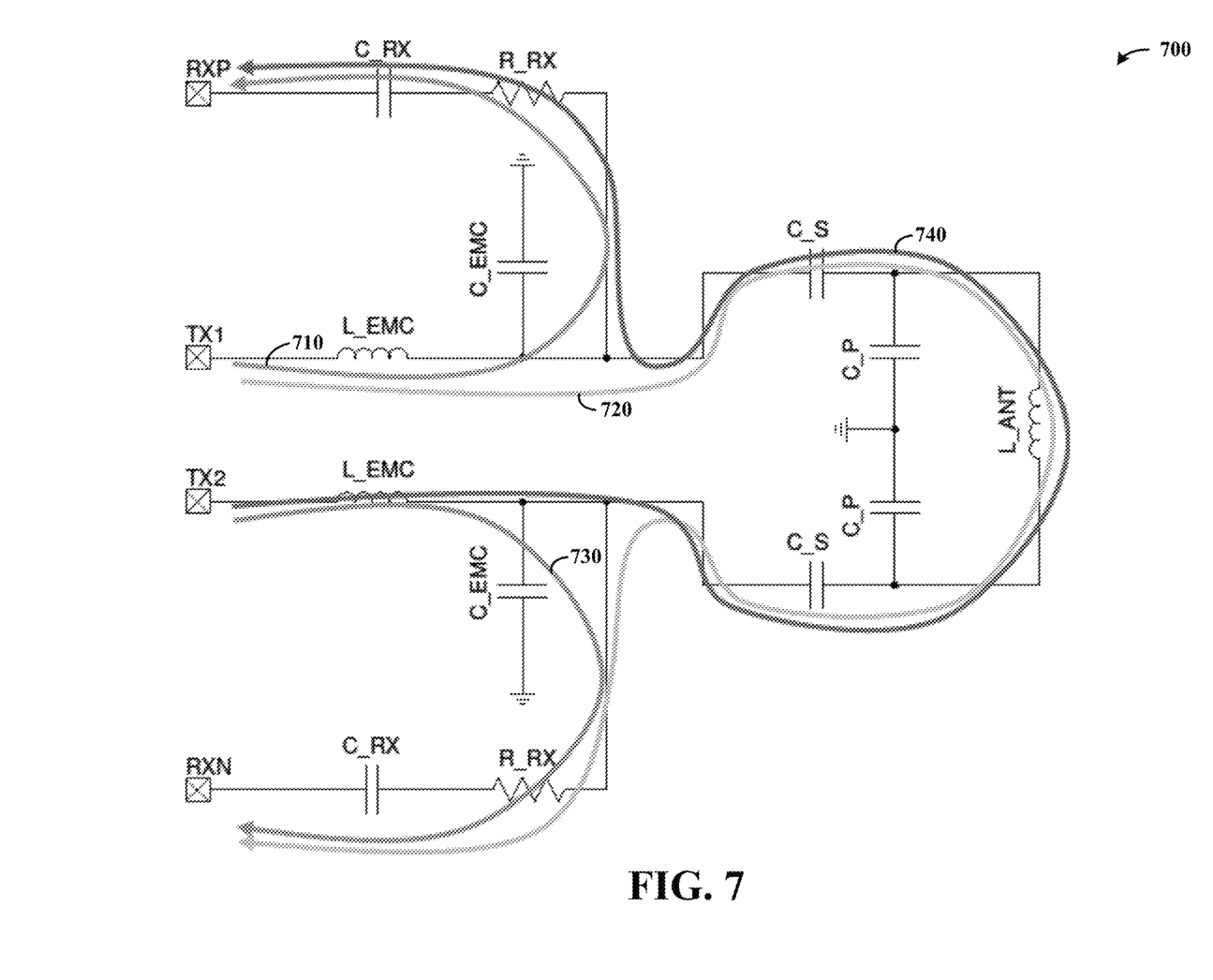
FIG. 7 shows a differential RF matching circuit, in accordance with one or more aspects of the disclosure.

FIG. 7 shows a differential RF matching circuit 700, in accordance with one or more aspects of the disclosure. Two different transmitters TX1 and TX2 are provided for generating respective test signals that are communicated on one or more test signal paths as shown. Specifically, transmitter TX1 can be used to transmit test signals on path 710 to receiver RXP, or on path 720 to receiver RXN. Transmitter TX2 can be used to transmit test signals on path 730 to receiver RXN, or on path 740 to receiver RXP. Switching circuitry may be implemented, for example, to selectively couple/decouple the transmitters TX1 and TX2 to the receivers RXP and RXN.

Accordingly, a variety of test paths may be utilized to test different circuitry within the differential RF matching circuit 700. For instance, a test procedure for a single-end RF front-end may involve activating TX1 (with TX2 off), activating TX2 (with TX1 off), or activating TX1 and TX2. For each case, sub-cases may utilize different transmitter driver output impedance configurations (e.g. low-Z, high-Z, or intermediate (e.g., 20 ohms)). Furthermore, different RXP input resistances (AGC resistance) can be utilized.

A variety of characteristics can be detected. For instance, voltage and/or current at TX1/TX2, voltage at RXP and/or RXN, phase from TX1/TX2 to RXP or from TX1/TX2 to RXN, can be captured. Out of the measured results, a variety of characteristics can be acquired. For example, gain can be determined from TX1 to RXP and to the antenna, from TX2 to RXP and to the antenna, or from TX1 and TX2 to RXP and to the antenna. Phase (rel.) from TX1, TX2, or a combination of TX1 and TX2, to the antenna can be determined. Parameters can be checked versus limits for each case independently, compared to each other (e.g., for path 1/2 mismatch), or compared to a combined test (both TX1 and TX2) in which an expected result is doubled RXP voltage and related impact on phase. Deviation from what is expected may be indicative of gain/phase mismatch in the transmitter system (e.g., IC and/or front-end). For calibration, the measured results of the different cases may be used to immediately generate calibration configurations.

Figure 8:
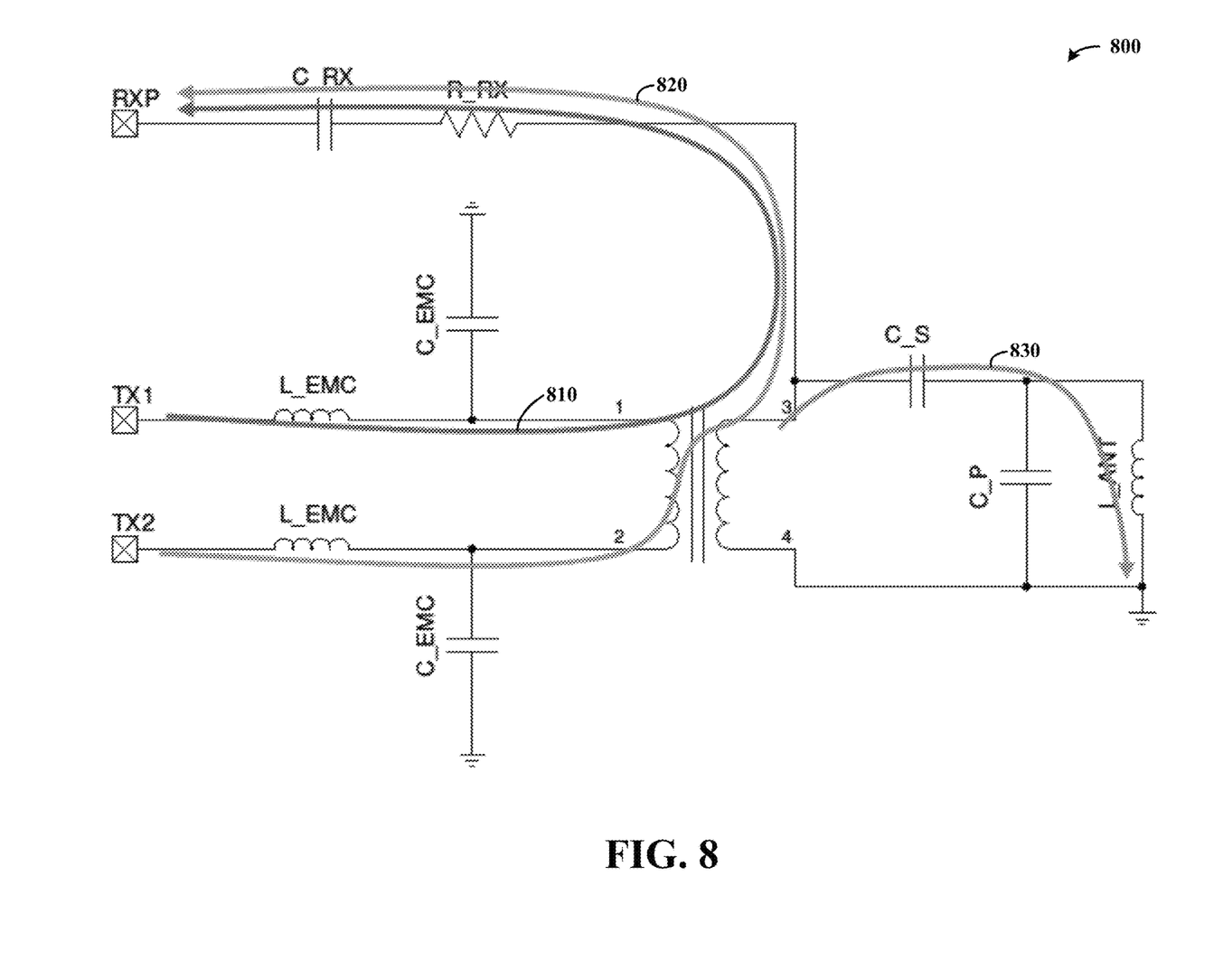
FIG. 8 shows an RF coupling circuit, in accordance with one or more aspects of the disclosure.

FIG. 8 shows an RF coupling circuit 800 with a single-ended receiver and antenna, in accordance with one or more aspects of the disclosure. Test path 810 is from TX1 to RXP and test path 820 is from TX2 to RXN. Test path 830 may be coupled from TX1, TX2 or both TX1 and TX2. Accordingly, test procedures may involve one or more of: activating TX1 (with TX2 off); activating TX2 (with TX1 off), and activating both TX1 and TX2. For each case, sub-cases can be implemented using different TX driver output impedance configurations (e.g. low-Z, high-Z, or intermediate (e.g., 20 ohms)). Furthermore, different RXP input resistances (AGC resistance) can be utilized. A variety of information/characteristics can be captured, such as voltage and/or current at TX1/TX2, voltage at RXP, and phase from TX1 to RXP and/or from TX2 to RXN. From this information, gain can be determined from TX1 to RXP and to the antenna, from TX2 to RXP and to the antenna, or from TX1 and TX2 to RXP and to the antenna. Phase (rel.) can be determined from TX1 to the antenna, from TX2 to the antenna, and/or from both TX and TX2 to the antenna. Parameters can be checked against limits/tolerances, such as by comparing to each other for path 1/2 mismatch, comparing to a combined test (both TX1 and TX2) in which RXP voltage is expected to double and further an expected impact occurs with phase. Deviations may indicated a gain/phase mismatch in the transmitter system (e.g., IC and/or front-end). Again, results of the different cases may be used to generate calibration configurations.

Figure 9:
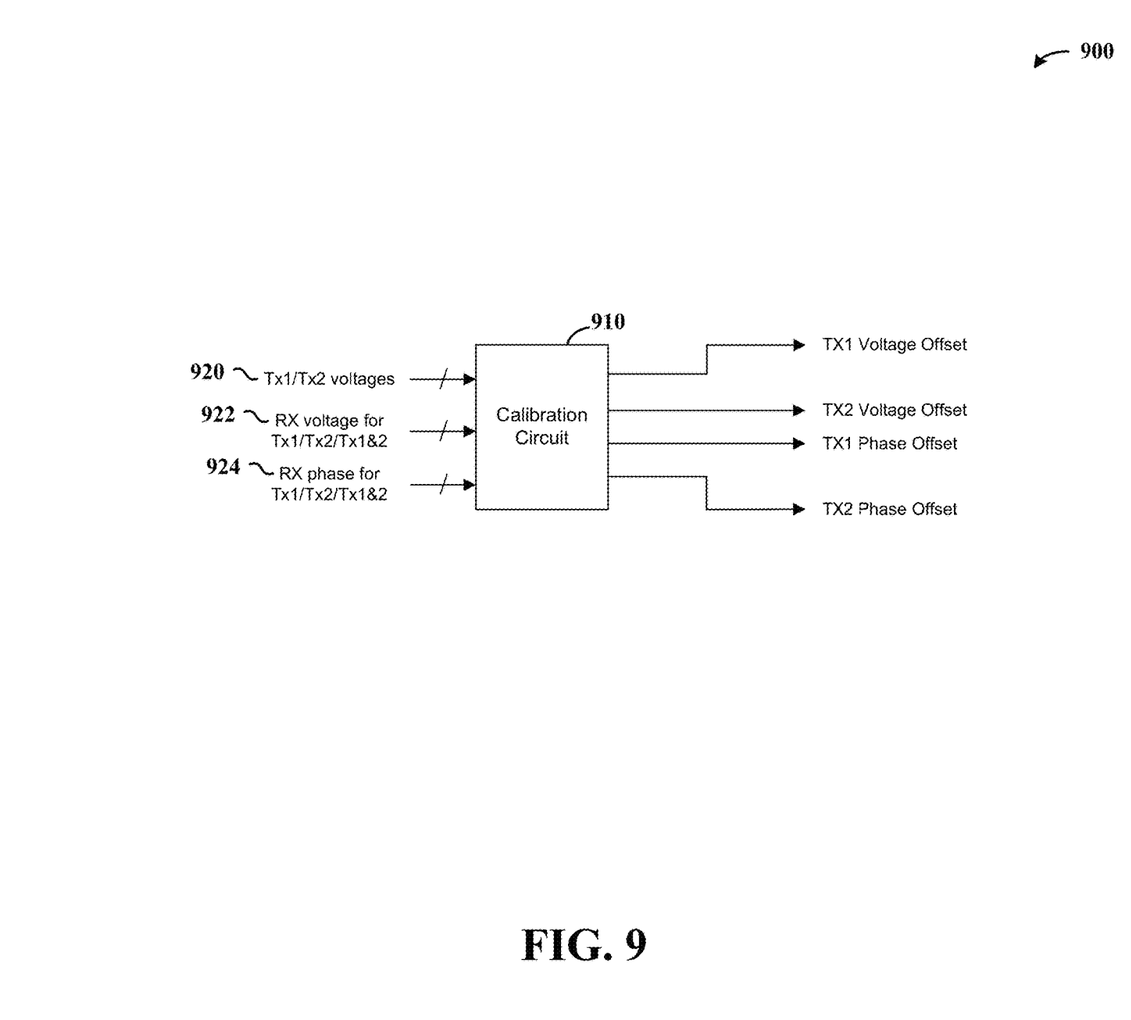
FIG. 9 shows a calibration apparatus, in accordance with one or more aspects of the disclosure.

FIG. 9 shows a calibration apparatus 900, in accordance with one or more aspects of the disclosure. The circuit 900 includes calibration circuit 910 and respective input circuits at 920, 922 and 924 that provide voltages for one or more transmitters (TX1, TX2), receiver voltage for test signals provided by one or more of the transmitters, and receiver phase for test signals provided by one or more of the transmitters. Calibration outputs are provided, such as for providing voltage and/or phase offset values for one or more transceivers (TX1, TX2).

Figure 10:
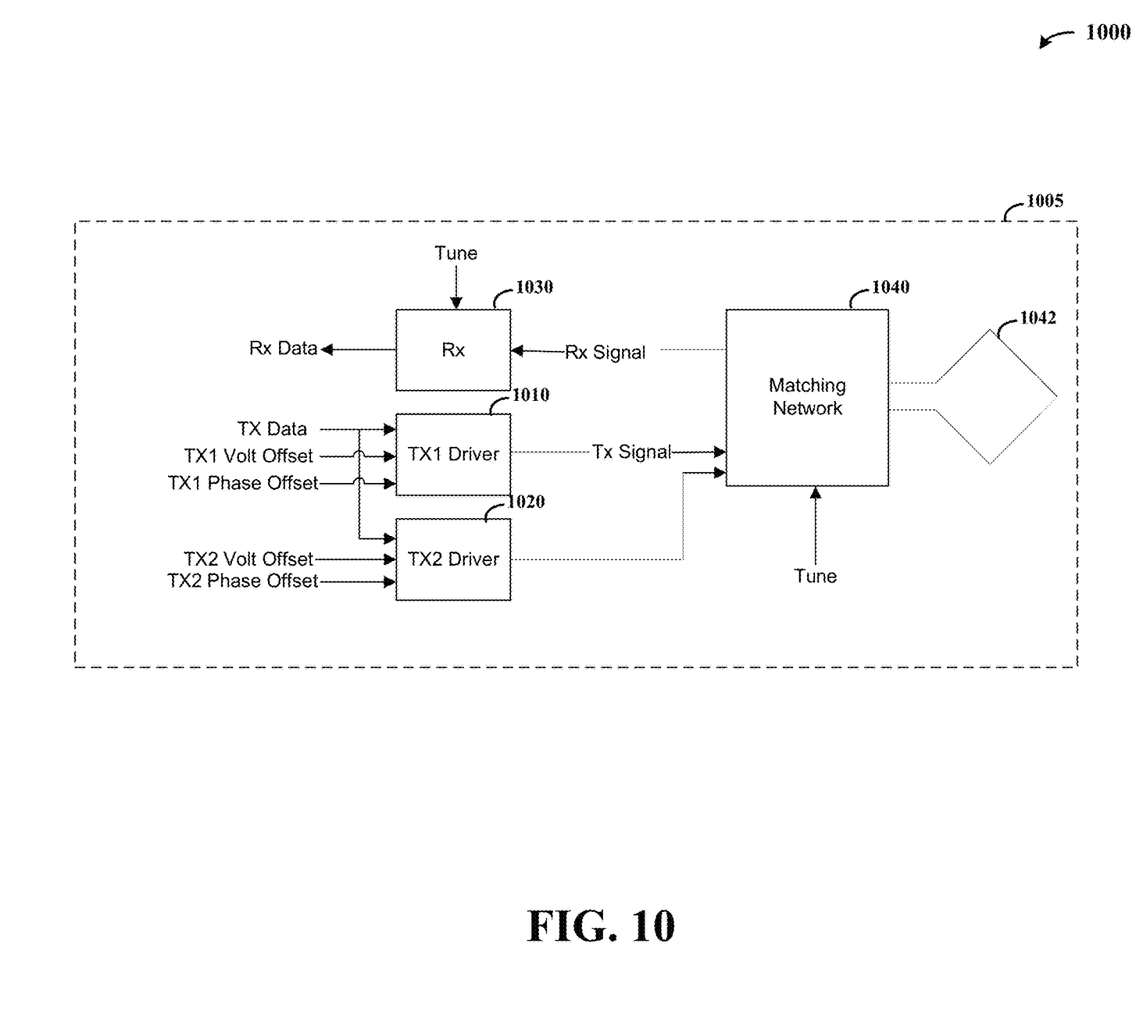
FIG. 10 shows an apparatus for testing impedance-matching circuitry with two transmitters, in accordance with one or more aspects of the disclosure.

FIG. 10 shows an apparatus 1000 for testing impedance-matching circuitry with two transmitters, in accordance with one or more aspects of the disclosure. The apparatus 1000 includes transmitter 1010, transmitter 1020, and receiver 1030, which operate with an impedance matching network 1040 and antenna 1042 for communicating RF signals with remote devices. The transmitters 1010 and 1020 generate test signals that are passed to the receiver 1030 via the impedance matching network 1040, such as in a manner characterized herein. Receiver data can analyzed for the test signals and utilized to assess the impedance matching network 1040. Further, calibration can be performed, for subsequently providing voltage of phase offsets as shown, to one or both of the transmitters 1010 and 1020. The circuitry may be integrated on a common card 1005. Various embodiments may utilize other or additional control signals, such as for compensating transmitter resistance.

Figure 11:
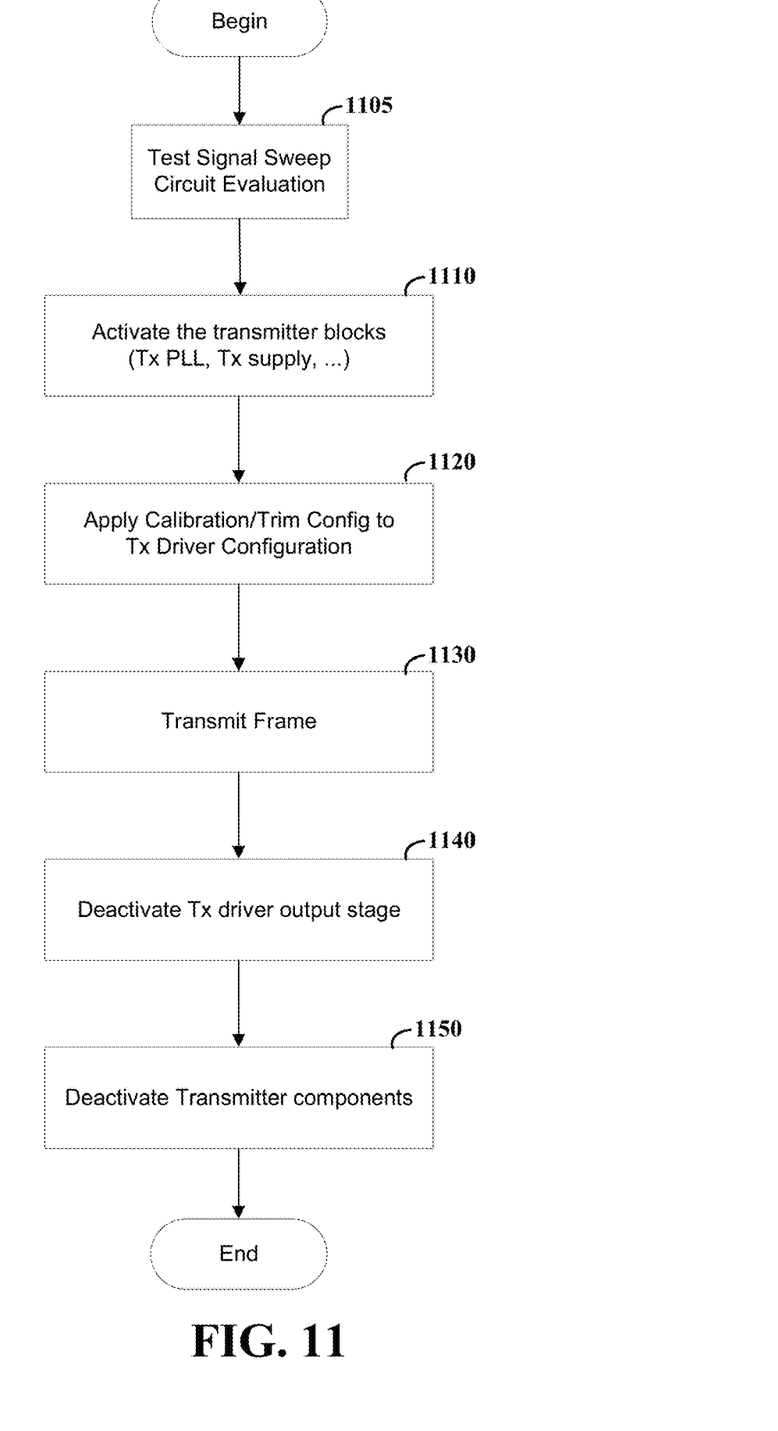
FIG. 11 shows a method for transmitting a frame, in accordance with one or more aspects of the disclosure.

FIG. 11 shows a method for transmitting a frame, in accordance with one or more aspects of the disclosure. A test-signal sweep circuit evaluation is carried out at block 1105, in a manner consistent with one or more embodiments herein (e.g., in accordance with FIG. 6), from which calibration parameters are obtained. At block 1110, transmitter blocks are activated, and calibration/trim configuration is carried out at block 1120, using parameters determined via the test signal sweep evaluation. At block 1130, a frame is transmitted, after which the transmitter driver is deactivated at block 1140 and other transmitter components may be deactivated at block 1150. The calibration/trim configuration may be calculated during the transmission or generated right away after the test signal sweep test sequence, and stored as calibration offset.

Various blocks, modules or other circuits may be implemented to carry out one or more of the operations and activities described herein and/or shown in the figures. In these contexts, a "block" (also sometimes "logic circuitry" or "module") is a circuit that carries out one or more of these or related operations/activities (e.g., sensing, testing, or frequency sweeping). For example, in certain of the above-discussed embodiments, one or more modules are discrete logic circuits or programmable logic circuits configured and arranged for implementing these operations/activities, as in the circuit modules shown in FIGS. 1 and 2. In certain embodiments, such a programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a CPU hardware-based circuit and a set of instructions in the form of firmware, where the first module includes a first CPU hardware circuit with one set of instructions and the second module includes a second CPU hardware circuit with another set of instructions.

Certain embodiments are directed to a computer program product (e.g., nonvolatile memory device), which includes a machine or computer-readable medium having stored thereon instructions which may be executed by a computer (or other electronic device) to perform these operations/activities.

Based upon the above discussion and illustrations, those skilled in the art will readily recognize that various modifications and changes may be made to the various embodiments without strictly following the exemplary embodiments and applications illustrated and described herein. For example, different characteristics can be analyzed, or a combination of such characteristics can be analyzed. A single frequency can be used, or a variety of frequencies can be carried out in a sweep. A single test signal pattern can be used, or a variety of test signal patterns may be used. Further, other types of circuitry (e.g., non-RF circuitry) can be tested with an auto-sweep. Such modifications do not depart from the true spirit and scope of various aspects of the invention, including aspects set forth in the claims.

What is claimed is:

1. An apparatus comprising:
impedance-matching circuitry configured and arranged to match an impedance of a radio frequency (RF) antenna, and to communicate signals between the RF antenna and receiver circuitry that processes RF signals received via the RF antenna;
a transmitter, including a combinatorial test controller, configured and arranged to transmit signals to remote devices via the RF antenna, and to auto-sweep the impedance-matching circuitry by communicating a plurality of test signals to the impedance-matching circuitry in a test mode;
switching circuitry configured and arranged to route the plurality of test signals generated by the transmitter to sensor circuitry via the receiver circuitry when the apparatus is in the testing mode;
the sensor circuitry configured and arranged to detect a characteristic of each of the plurality of test signals as passed through the impedance-matching circuitry; and
testing circuitry configured and arranged with the sensor circuitry to indicate compliance of the impedance-matching circuitry with a design specification by:
for each of the plurality of test signals generated for the auto-sweep, comparing the detected characteristic of each test signal to an expected characteristic for the test signal,
in response to the comparisons, assessing compliance of the impedance-matching circuitry with a design specification, and
generating and transmitting an output indicative of compliance of the impedance-matching circuitry with the design specification.

2. The apparatus of claim 1, wherein each test signal has at least one of:
a designated frequency that is different than the designated frequency of other test signals of the plurality of test signals, a designated test signal pattern that is different than a designated test signal pattern of the other test signals, or a combination thereof.

3. The apparatus of claim 1, wherein:
the sensor circuitry is configured and arranged to detect multiple characteristics for each of the test signals; and
the testing circuitry is configured and arranged with the sensor circuitry to, for each of the plurality of test-signals generated for the auto-sweep, compare each of the detected characteristics to respective expected characteristics for the test signal.

4. The apparatus of claim 1, wherein the transmitter is configured and arranged to communicate respective ones of the plurality of test signals under different driver output impedance configurations, and the testing circuitry is configured and arranged to compare the detected characteristics at each of the different driver output impedances to expected characteristics for each driver output impedance.

5. The apparatus of claim 1, wherein the sensor circuitry includes a receiver configured and arranged to provide different input resistances for receiving respective ones of the test signals, and the testing circuitry is configured and arranged to compare the detected characteristics at each of the different input resistances to expected characteristics for each input resistance.

6. The apparatus of claim 1, wherein
the transmitter is configured and arranged to communicate respective ones of the plurality of test signals under different driver output impedance configurations,
the sensor circuitry includes a receiver configured and arranged to provide different input resistances for receiving respective ones of the plurality of test signals, and
the testing circuitry is configured and arranged to compare the detected characteristics at each of respective combinations of the output impedance configurations and input resistances to expected characteristics for each of the respective combinations.

7. The apparatus of claim 1, wherein the transmitter is configured and arranged to communicate the test signals as continuous-wave signals, each continuous-wave signal having a constant amplitude and frequency.

8. The apparatus of claim 1, wherein the sensor circuitry is configured and arranged to detect at least one of voltage amplitude, phase, and current characteristics.

9. The apparatus of claim 1, wherein the switching circuitry is further configured and arranged to:
in an operational mode, route the RF communication signals generated by the transmitter to the antenna via the impedance-matching circuitry, and therein transmitting the RF communication signals to a remote receiver.

10. The apparatus of claim 1, wherein the transmitter is configured and arranged to transmit the RF signals to remote devices via the RF antenna and the impedance-matching circuitry, based on the detected characteristics.

11. The apparatus of claim 1, wherein the transmitter and sensor circuitry are configured and arranged to auto-sweep the impedance-matching circuitry by:
setting the transmitter to one of a plurality of designated sweep frequencies or test signal patterns;
communicating a test signal at the one of the designated sweep frequencies or test signal patterns;

detecting a characteristic of the test signal at the one of the designated sweep frequencies or test signal patterns; and repeating the steps of setting, communicating and detecting for each of the plurality of test signal sweeps.

12. The apparatus of claim 1, wherein the testing circuitry is configured and arranged with the sensor circuitry to calibrate the transmitter in response to the comparisons, by setting an operational parameter of the transmitter based on the comparisons.

13. The apparatus of claim 1, wherein the transmitter includes two different transmitters respectively configured and arranged to transmit respective ones of the plurality of test signals.

14. A method comprising:
auto-sweeping impedance-matching circuitry, the impedance-matching circuitry being configured and arranged to match an impedance of a radio frequency (RF) antenna and to communicate signals between the RF antenna and receiver circuitry that processes RF signals received via the RF antenna, by
in a testing mode, using a transmitter configured and arranged to transmit a plurality of test signals to remote devices via the impedance-matching circuitry to the RF antenna, communicating the plurality of test signals to the impedance-matching circuitry;
receiving the plurality of test signals from the impedance-matching circuitry by the receiver circuitry;
detecting a characteristic of each of the plurality of test signals as the plurality of test signals are passed through the impedance-matching circuitry;
for each of the test signals generated for the auto-sweep, comparing the detected characteristic of the test signal to an expected characteristic for the test signal; and
in response to the comparisons, generating an output indicative of compliance of the impedance-matching circuitry with a design specification.

15. The method of claim 14, wherein auto-sweeping the impedance-matching circuitry includes communicating each test signal with at least one of: a designated frequency that is different than the designated frequency of another test signal of the plurality of test signals, a designated test signal pattern that is different than the designated test signal pattern of other test signals of the plurality of test signals, or a combination thereof.

16. The method of claim 14, wherein:
detecting a characteristic of each of the test signals as passed through the impedance-matching circuitry includes detecting multiple characteristics for each of the plurality of test signals; and
comparing the detected characteristic of the test signal includes comparing each of the multiple detected characteristics to respective expected characteristics for the test signal.

17. The method of claim 14, wherein communicating the plurality of test signals includes communicate the test signals as continuous-wave signals, each continuous-wave signal having a constant amplitude and frequency.

18. The method of claim 14, wherein auto-sweeping the impedance-matching circuitry includes:
setting the transmitter to one of a plurality of designated sweep frequencies or test signal patterns;
communicating a test signal at the one of the designated sweep frequencies or test signal patterns;
detecting a characteristic of the test signal at the one of the designated sweep frequencies or test signal patterns; and
repeating the steps of setting, communicating and detecting for each of a plurality of test signal sweeps.

19. The method of claim 14, further including calibrating the transmitter in response to the comparisons, by setting an operational parameter of the transmitter based on the comparisons.

20. An apparatus comprising:
a radio frequency (RF) antenna;
a transmitter;
a receiver;
impedance-matching circuitry configured and arranged to match an impedance of the RF antenna, to communicate signals from the transmitter to the RF antenna, and to communicate RF signals received on the RF antenna to the receiver; and
testing circuitry configured and arranged with the transmitter and receiver to auto-sweep the impedance-matching circuitry by:
operating the transmitter to transmit continuous wave test signals to the impedance-matching circuitry;
detecting amplitude and phase of each continuous wave test signal as having passed through the impedance-matching circuitry and having been received at the receiver;
comparing the detected amplitude and phase of each of the continuous wave test signals to expected amplitude and phase for a particular frequency at which the continuous wave test signals are transmitted; and
generating and transmitting an output indicative of compliance of the impedance-matching circuitry with a design specification based on the comparison.

* * * * *